(12) United States Patent
Tempel

(10) Patent No.: US 7,399,673 B2
(45) Date of Patent: Jul. 15, 2008

(54) METHOD OF FORMING A CHARGE-TRAPPING MEMORY DEVICE

(75) Inventor: Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 307 days.

(21) Appl. No.: 11/177,245

(22) Filed: Jul. 8, 2005

(65) Prior Publication Data

US 2007/0007586 A1    Jan. 11, 2007

(51) Int. Cl.
*H01L 21/8242* (2006.01)
*H01L 21/336* (2006.01)

(52) U.S. Cl. ............... 438/259; 438/593; 257/E21.655

(58) Field of Classification Search ......... 438/211–212, 438/257, 259, 270–271, 589, 593–594; 257/E21.551, 257/E21.655
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 7,060,574 B2 * | 6/2006 | Kim et al. | 438/297 |
| 2004/0180496 A1 | 9/2004 | Hsiao et al. | |
| 2005/0032308 A1 | 2/2005 | Hsiao et al. | |
| 2005/0082600 A1 | 4/2005 | Hsu et al. | |
| 2006/0108646 A1* | 5/2006 | Hofmann et al. | 257/390 |

FOREIGN PATENT DOCUMENTS

| | | |
|---|---|---|
| DE | 100 39 441 A 1 | 2/2002 |
| DE | 101 29 958 A 1 | 1/2003 |
| DE | 102 04 873 C 1 | 10/2003 |
| DE | 102 19 917 A 1 | 11/2003 |
| DE | WO2004/107435 | * 12/2004 |
| JP | 09-014836 | 1/1997 |

OTHER PUBLICATIONS

English language abstract of Japanese Publication No. 09-014836.
Eitan, B., et al., "Can NROM, a 2-bit, Trapping Storage NVM Cell, Give a Real Challenge to Floating Gate Cells?," International Conference on Solid State Devices and Materials, Tokyo, 1999 Saifun Semiconductors, Ltd., 3 pages.
Willer, J., et al., "UMEM: A U-shape Non-Volatile-Memory Cell," Proc. IEEE NVSMW, Monterey, pp. 42-43, 2003.

* cited by examiner

*Primary Examiner*—Thanhha Pham
(74) *Attorney, Agent, or Firm*—Slater & Matsil, L.L.P.

(57) ABSTRACT

In a charge-trapping device having an array of memory cells, which are controlled by word lines buried in trenches within a substrate, further trenches are formed parallel to said word lines within said substrate. These subdivide diffusion regions adjacent to the word lines into each a first diffusion region adjacent to a first trench of a first charge-trapping memory cell and a second diffusion region adjacent to a first trench of a second charge-trapping memory cell. The depth of the further trench is sufficient to impede hot charge carrier exchange between neighboring memory cells. For this purpose the further trenches are filled with dielectric material, e.g., an oxide. The depth of the further trenches may be, e.g., half of that of the word line trench, and the width may, e.g., amount to 15-20 nm.

17 Claims, 10 Drawing Sheets

FIG 13A X-section D-D
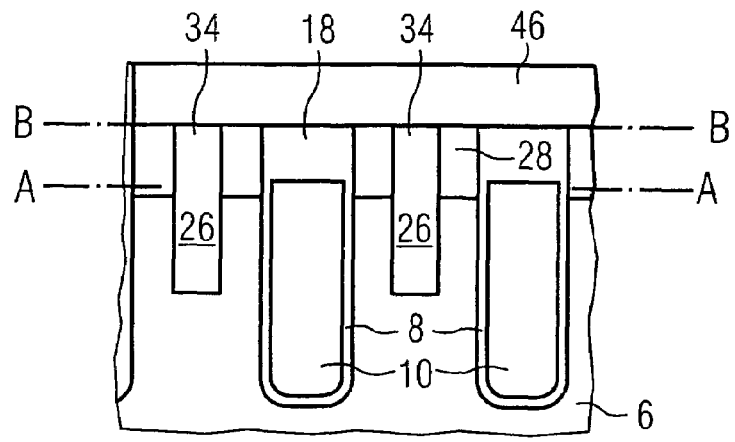
FIG 13B Level B-B
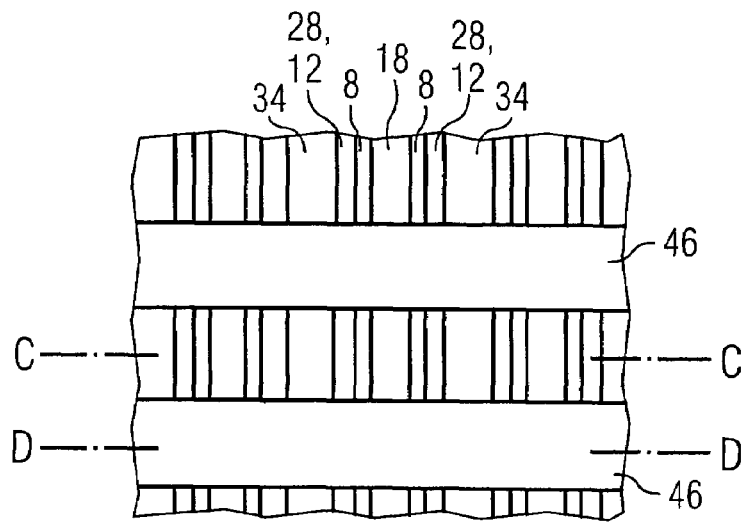
FIG 13C Level A-A
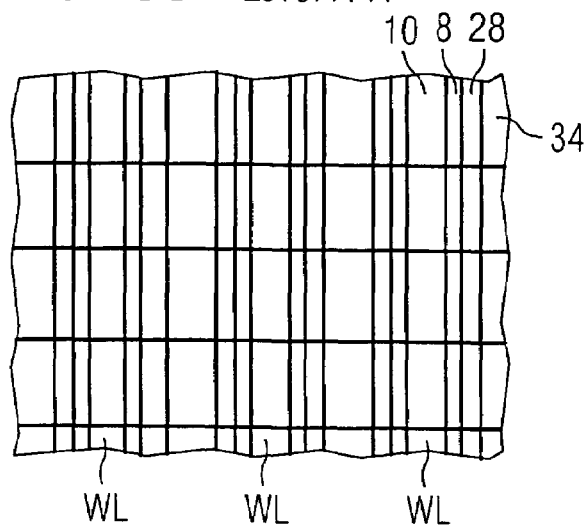

FIG 14A  X-section C-C
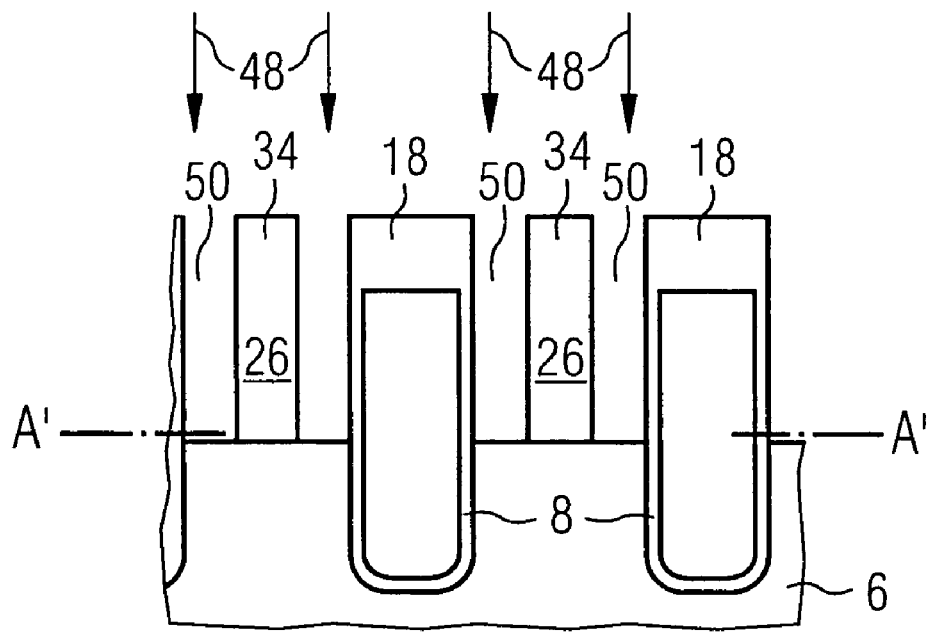
FIG 14B  Level A'-A'
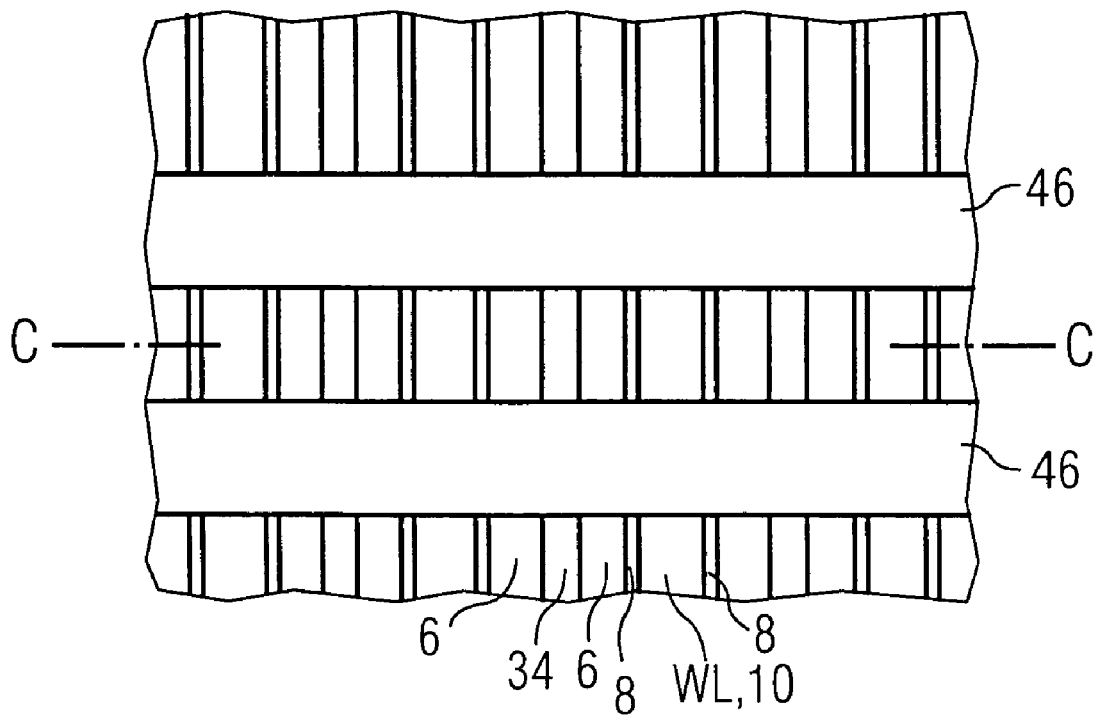

FIG 15A  X-section C-C
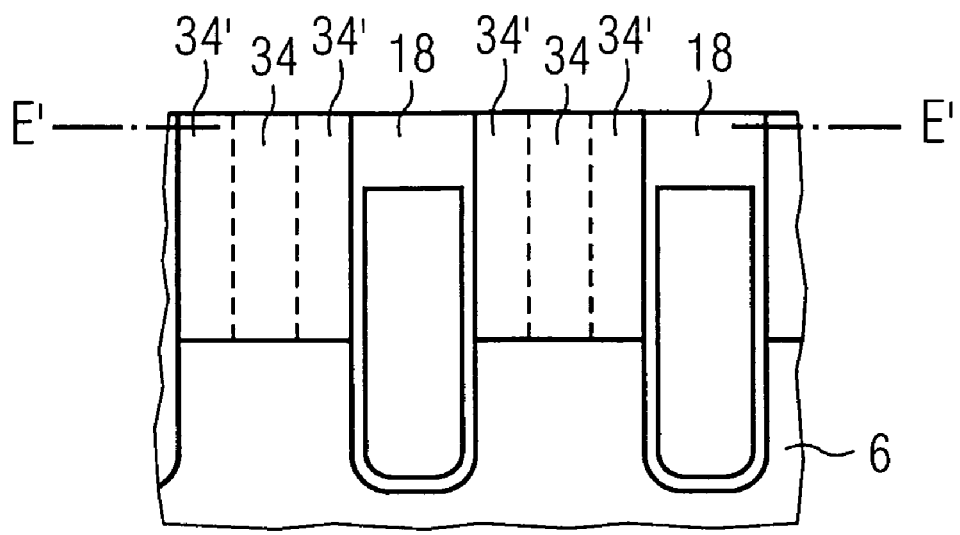
FIG 15B  Level E'-E'
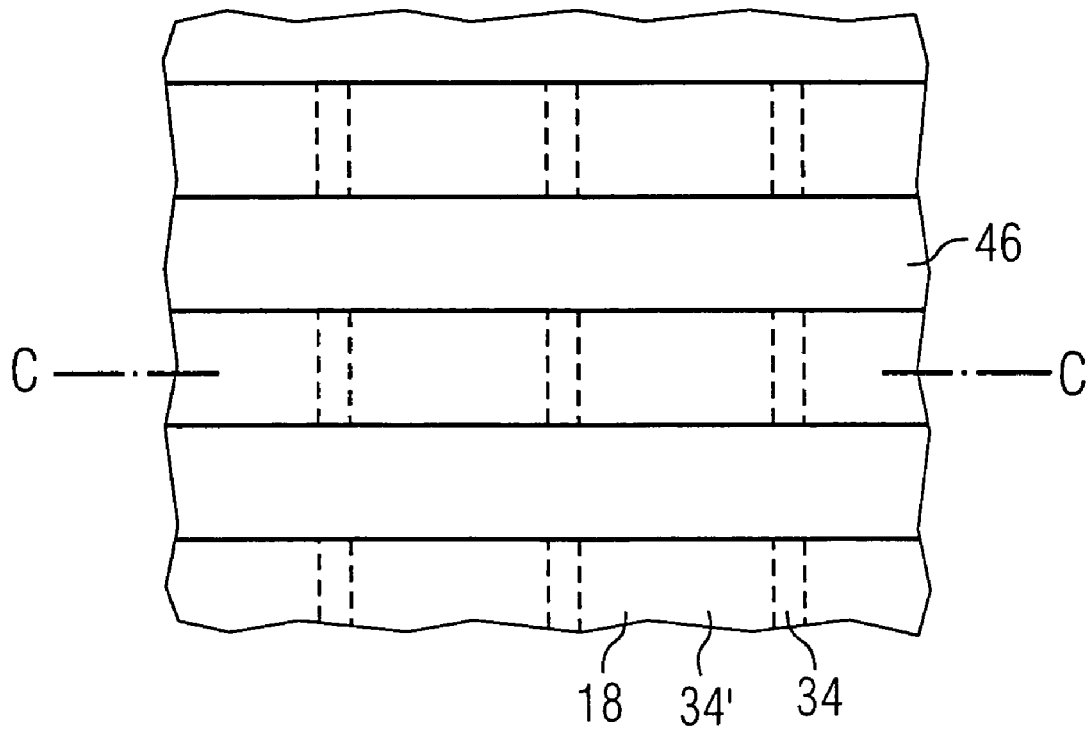

FIG 16A  X-section C-C
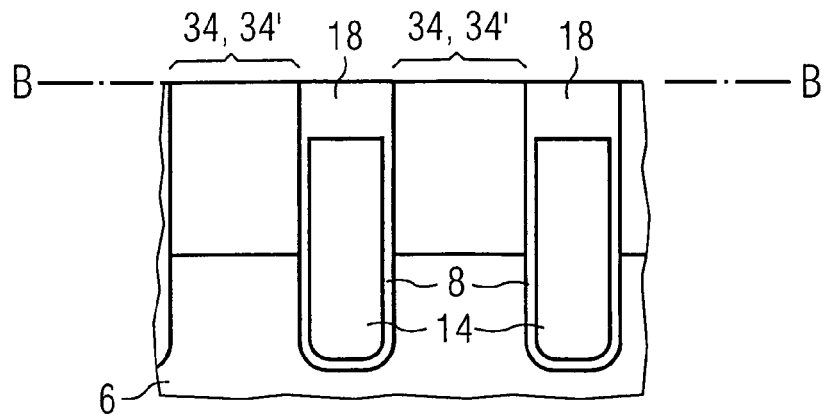
FIG 16B  X-section D-D
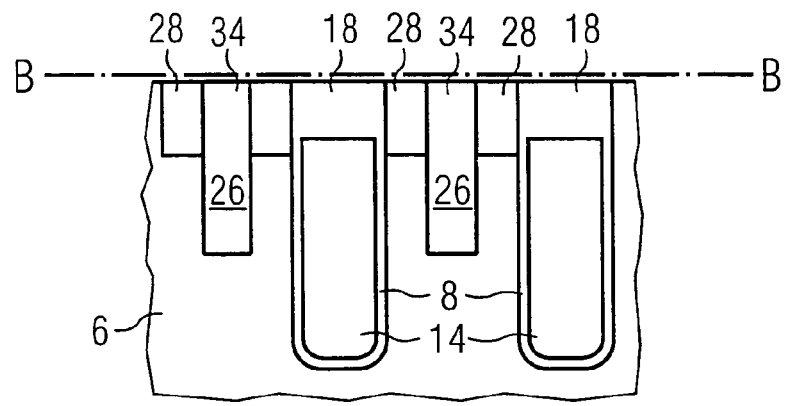
FIG 16C  Level B-B
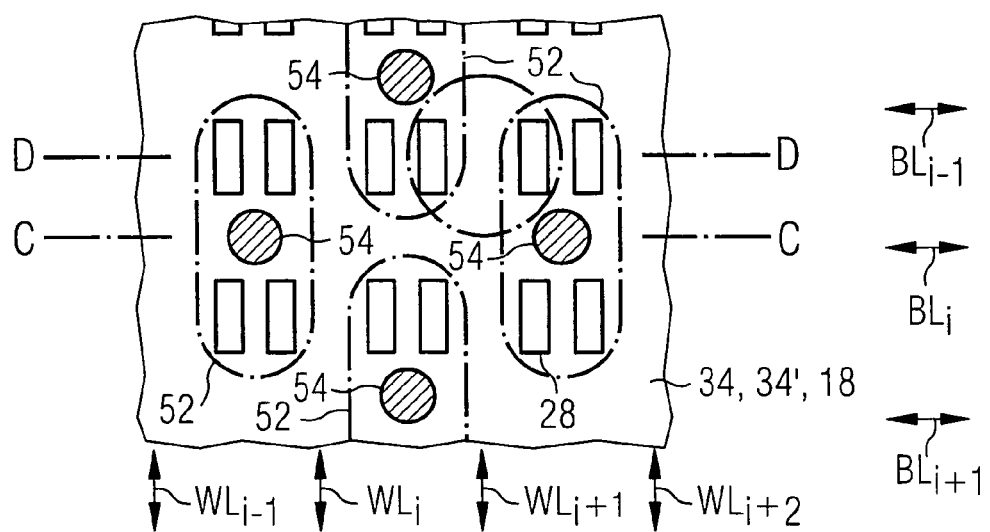

METHOD OF FORMING A CHARGE-TRAPPING MEMORY DEVICE

TECHNICAL FIELD

The invention relates to a method of forming a charge-trapping memory device, particularly an NROM or SONOS memory device. Such a device comprises a memory layer sequence of dielectric materials provided for programming by means of trapping charge carriers.

BACKGROUND

Non-volatile memory has become increasingly important for mass storage media, cards and code flash products. Non-volatile memory cells that are electrically programmable and erasable can be realized as charge-trapping memory cells, which comprise a memory layer sequence of dielectric materials with a memory layer confined between confinement layers of dielectric material, the latter having a larger energy band gap than the dielectric material of the memory layer.

The memory layer sequence is arranged between a channel region within a semiconductor body and a gate electrode of a transistor, the gate electrode being provided to control the channel by means of an applied electric voltage. Examples of charge-trapping memory cells are the SONOS memory cells, in which each confinement layer is an oxide and the memory layer is a nitride of the semiconductor material, commonly silicon (see e.g., U.S. Pat. No. 5,768,192 and U.S. Pat. No. 6,011,725, which are incorporated herein by reference).

Applying a huge enough positive voltage to the control gate of a SONOS device will generate an electrical field condition for tunnelling of electrons from an inversion channel below the gate through the confinement layer. These electrons can then be trapped in the charge trapping layer. The trapped charge carriers change the threshold voltage of the cell transistor structure. Different programming states can be read by applying the appropriate reading voltages.

According to a planar memory cell concept as shown, e.g., in Eitan, et al., "Can NROM, a 2-bit, trapping Storage NVM cell, give a real challenge to floating gate cells?", Proc. Solid State Devices and Materials, pp. 1-3, Tokyo 1999, which is incorporated herein by reference, charge-trapping memory devices can be provided with, e.g., buried bit lines, which electrically connect the source/drain regions of the memory cells. A memory layer sequence, typically an oxide-nitride-oxide layer sequence, is located above the channel regions between corresponding source/drain regions. Above the buried bit lines, a thick oxide is formed as an electrically insulating region, especially to separate the gate electrode sufficiently from the buried bit lines. The memory layer sequence is confined to the channel region and overlaps the source/drain regions only slightly.

This fundamentally new concept called "NROM" provided by Eitan, et al. has the following important features:

(a) the programming of memory cells by means of hot channel electrons is combined with a delete operation by means of hot holes;

(b) a duplicated storage location per memory cell, i.e., on both junction sides of a transistor channel region; and (c) a reverse read operation, which allows a separate detection of the storage content on both sides of the transistor; the term "reverse" refers to the direction of the voltage drop with respect to the source and drain regions and indicates that this direction is reverse to that applied during a programming operation.

Recently, a vertical memory cell design has been developed (Willer, J., et al. in "UMEM: a U-shape Non-Volatile-Memory Cell", Proc. IEEE NVSMW, Monterey, pp. 42-43, 2003), which is incorporated herein by reference. According to this design, the word line is buried in the substrate with, e.g., 60 nm deep trenches. Advantageously, the channel length is folded around the bottom of the word line trenches resulting in an effective channel length of, e.g., 100 . . . 150 nm. Diffusion regions are arranged adjacent to the trenches connecting neighboring memory cells, which are arranged perpendicular to the word line direction.

In this design the ONO-layer sequence is deposited on the trench sidewalls. Accordingly, the storage region within the ONO-layer sequence, or more precisely within the memory layer typically provided by a nitride layer, is adjacent to the diffusion regions in a top region of the two opposite sidewalls of the trench.

With decreasing cell sizes, trenches forming the word lines and thus the regions wherein hot charge carriers such as electrons are generated move closer with respect to each other. The mean travel distance of hot charge carriers within the substrate may amount to 70 nm. Consequently, with trench distances approaching the 100 nm limit, the probability of trapping charge carriers generated during programming of a neighboring memory cell in the memory layer of a currently passive cell exponentially increases with decreasing cell sizes. The problem is schematically depicted in FIG. 1. Erroneous bit storage may result in those memory cells, when the number of charge carriers trapped accumulates.

SUMMARY OF THE INVENTION

In one aspect, the present invention provides a method of forming charge-trapping memory devices comprising a memory layer sequence and buried word lines, which removes the problem of a charge carrier exchange between neighboring memory cells during a programming operation.

A first embodiment of the method comprises forming a charge-trapping memory device having an array of memory cells, including a semiconductor substrate with a main surface and trenches formed within the substrate having sidewalls. The sidewalls are doped to form U-shaped channel regions. A sequence of layers comprising dielectric materials is deposited on the sidewalls of the trenches. Each layer sequence of dielectric materials includes a bottom confinement layer, a memory layer and a further top confinement layer. The trenches are filled with a conductive material that overlies the layer sequence to form gate electrodes and word lines. The main surface adjacent to the trenches is doped to form diffusion regions, which serve as the source and/or drain of each of the memory cells. Further trenches parallel to the first trenches are formed within the substrate thereby subdividing the diffusion regions into each a first diffusion region adjacent to a first trench of a first charge-trapping memory cell and a second diffusion region adjacent to a first trench of a second charge-trapping memory cell. The further trenches are filled with dielectric material in order to impede hot charge carrier exchange between adjacent charge-trapping memory cells.

A second embodiment of the method comprises forming a charge-trapping memory device having an array of memory cells, including a semiconductor substrate with a main surface and trenches formed within the substrate having sidewalls. The sidewalls are doped to form channel regions. A sequence of layers comprising dielectric materials is deposited on the sidewalls of the trenches. Each layer sequence of dielectric materials includes a bottom confinement layer, a memory layer and a further top confinement layer. The trenches are filled with a conductive material that overlies the layer sequence to form gate electrodes and word lines. The main surface adjacent to the trenches is doped to form diffusion regions, which serve as a source and/or drain of each of the memory cells. Further trenches parallel to the first trenches are formed within the substrate by means of etching thereby subdividing the diffusion regions into each a first diffusion region adjacent to a first trench of a first charge-trapping memory cell and a second diffusion region adjacent to a first trench of a second charge-trapping memory cell. The further trenches are filled with dielectric material in order to impede hot charge carrier exchange between adjacent charge-trapping memory cells and planarizing. Bit line contacts are formed, which each coincidently contact the first and second diffusion regions subdivided by the forming of the further trench.

In other embodiments, a charge-trapping memory device includes an array of memory cells, which are formed in a semiconductor substrate. Each of the memory cells comprises a trench formed within the substrate. The trench has sidewalls, which are covered with a layer sequence of dielectric materials. The trench is filled with a conductive material to form a gate electrode and a word line. First and second diffusion regions are disposed adjacent to the trench sidewalls at a main surface of the substrate. The diffusion regions serve as a source and/or drain of the memory cell. A channel region is arranged within the substrate and has a U-shape for extending adjacent to the trench sidewalls from the first diffusion region to the second diffusion region. The layer sequence of dielectric materials includes a memory layer the is confined by confinement layers and provides a gate dielectric for the gate electrode and a hot charge carrier storage region adjacent to each of the diffusion regions. A further trench formed in the substrate is filled with a dielectric material. The further trench is arranged parallel to the trench, which forms a word line. The further trench serves to shield hot charge carrier exchange between adjacent charge-trapping memory cells.

According to embodiments of the invention, a further trench is provided, which is filled with dielectric material, which may be an oxide, or flowing glass. This further trench is arranged parallel to a buried word line according to the vertical NROM-cell concept and thus separates each two word lines from each other. Thereby, the further trench filled with the dielectric material only consumes a portion of the substrate between each two word lines. In other words, substrate portions on both sides of the further trenches serving as source/drain regions adjacent to the gate electrodes of the word lines are retained.

One goal of the further trench is not to separate the source/drain regions of neighboring memory cells, as they are—according to the virtual ground array concept—in any way connected to the same bit line contact. Rather, the further trenches have a depth, such that portions of the memory layer of neighboring memory cells facing each other are shielded by means of the dielectric material within the further trench. In particular, a space within the substrate adjacent to a diffusion region and to the charge-trapping layer of a first memory that is able to generate high energy charge carriers is shielded from the charge-trapping layer of a neighbouring memory cell. Consequently, accumulation of charges in other cells than those, which are actually programmed, is considerably reduced, if not impeded.

As the hot charge carrier generation space is typically located beneath a diffusion region near the substrate surface, the further trench that blocks hot charge carriers due to its dielectric material should have a depth amounting to about half of that of the depth of the buried word line in order to completely shield the charge-trapping layers from each other. For example, a buried word line having a depth of 60 nm needs a hot charge carrier blocking a trench with a depth of at least 30 nm as measured from the depth of the p/n-junction, i.e., the location where hot charge carriers are generated. Therein, it is supposed that the trench is arranged in the middle between each two word lines.

The minimum width of the trench is merely limited by a thickness needed to sufficiently absorb high energy charge carriers. Rather, the width is limited by lithographic capabilities. As minimum widths, which can be achieved by lithographic projection, will currently exceed 70 nm, a spacer technique narrowing the manufacturable trench width is advantageously employed to achieve trench widths down to 15-25 nm.

Advantageous aspects and embodiments are evident from the appended claims. The invention will become clearer with regard to certain embodiments when taken in conjunction with the accompanying drawings.

DESCRIPTION OF THE DRAWINGS

Preferred embodiments and examples of the method according to this invention will be further described in detail in connection with the appended drawings.

FIGS. 13a-16c show the further evolution of the memory cells of FIG. 12 in cross-sections and top views according to an option of the embodiment of the invention.

The following list of reference symbols can be used in conjunction with the figures:

| | |
|---|---|
| 2 | nitride layer |
| 4 | oxide layer |
| 6 | silicon substrate |
| 8 | ONO layer sequence |
| 10 | conductive filling |
| 12 | main surface of substrate |
| 14 | trench (buried word line) |
| 16 | recess etch |
| 18 | trench top oxide |
| 20 | diffusion region (prior to second trench etch) |
| 22 | diffusion implant |
| 24 | sidewall spacer |
| 26 | further trench (hot charge carrier blocking trench) |
| 28 | diffusion region (after separation due to 2nd trench etch) |
| 30 | channel stop implant |
| 32 | channel stop region |
| 34 | dielectric material filling of further trenches |
| 36 | metal layer on diffusion region |
| 38 | hot charge carriers |
| 40 | storage location in memory layer |
| 42 | channel region |
| 44 | hot charge carrier generation zone |
| 46 | hard mask |
| 48 | silicon etch |
| 50 | trenches after silicon etch |
| 52 | local interconnects |
| 54 | bit line contacts |
| 82 | bottom confinement layer |

| | |
|---|---|
| 84 | memory layer |
| 86 | top confinement layer |
| WL | word line, BL bit line |

DETAILED DESCRIPTION OF ILLUSTRATIVE EMBODIMENTS

In FIGS. 2-16 an embodiment of the method of forming a charge-trapping device according to embodiments of the invention is illustrated by means of cross-sections and top views of memory cells. The figures show a portion of an array including two adjacent memory cells, wherein the cross-sections are taken along the bit line direction, perpendicular to the word line direction.

Figure 1:
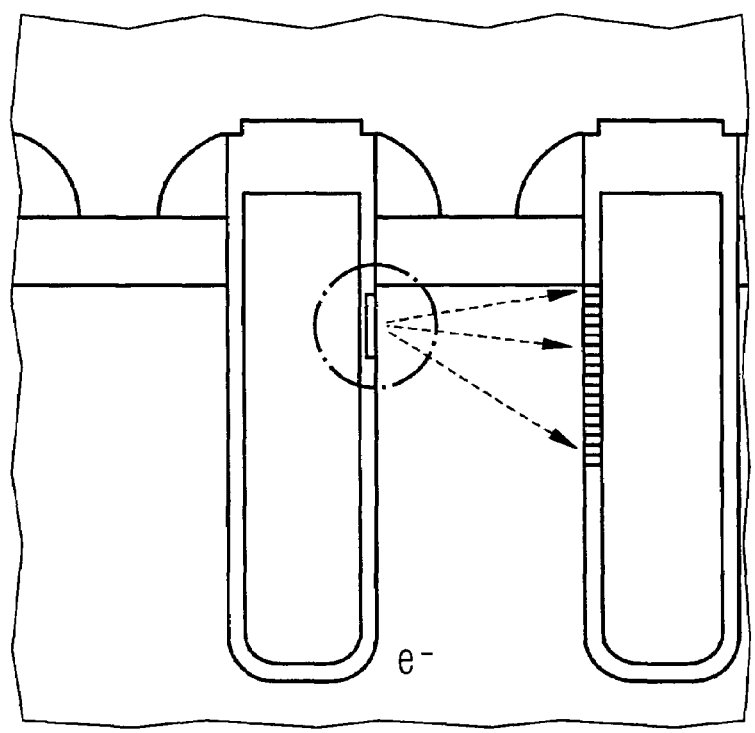
FIG. 1 shows a cross-section of memory cells according to the buried word line concept illustrating the problem of hot charge carriers generated in one memory cell and then being trapped in a memory layer of a neighboring memory cell.
Figure 2:
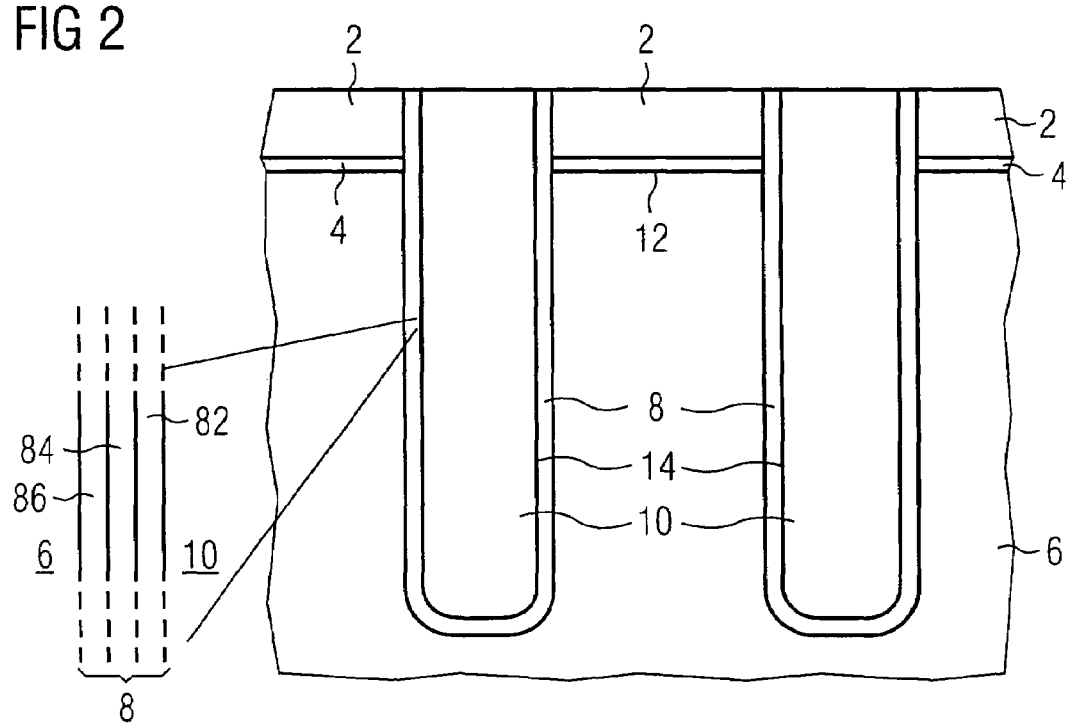
FIGS. 2-12 show a sequence of cross-sections of memory cells according to an embodiment of the invention.

FIG. 2 shows a cross-section of two memory cells serving as a starting point in order to illustrate the formation of a hot charge carrier blocking trench. A mono-crystalline silicon substrate 6 is provided. An oxide 4 is formed on the substrate surface 12 and a layer of nitride 2 is deposited thereupon. Using photolithographic techniques, trenches 14 are formed by exposing and developing a resist (not shown) and then etching the nitride layer 2 and the oxide layer 4. The resist is then stripped and etching is deep into the substrate 6 to a depth of about 60 nm. The trench has a width of about 75 nm. As the trench 14 will result in the formation of a word line, the length of the trench (perpendicular to the plane of the drawing in FIG. 2) scales with the array size. The etch step is performed anisotropically.

After cleaning, the memory layer 84 confined by the bottom confinement layer 82 and the top confinement layer 86 are deposited upon the substrate 6. In particular, an oxide layer of, e.g., 5 nm is deposited first, followed by a nitride layer having a thickness of 7 nm and then by a further oxide layer (e.g., 11 nm), resulting in an ONO layer sequence. The memory or charge-trapping layer is the nitride layer 84. After CMP- or etch removal of those portions of the ONO-layer not residing within trench 14, i.e., on a plane surface of the substrate, the trench 14 is filled with n$^+$-doped poly silicon as a conductive filling 10 to yield a gate electrode and a buried word line. A planarization step follows, which emerges to the situation shown in FIG. 2.

Figure 3:
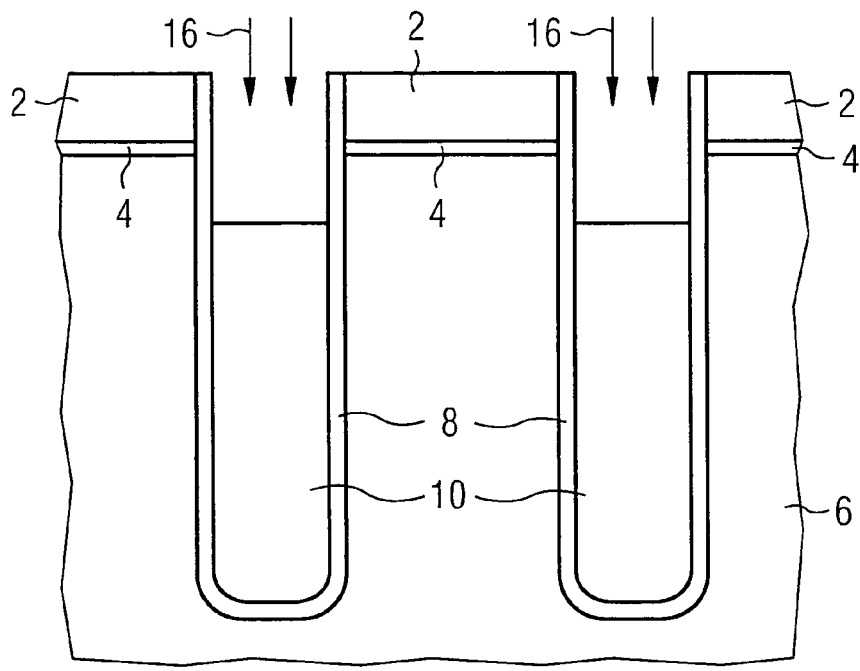

FIG. 3 illustrates the same cross-section as shown in FIG. 2, but after a recess of the conductive poly silicon filling 10 due to RIE- or wet etching 16 in a top portion of trench 14.

Figure 4:
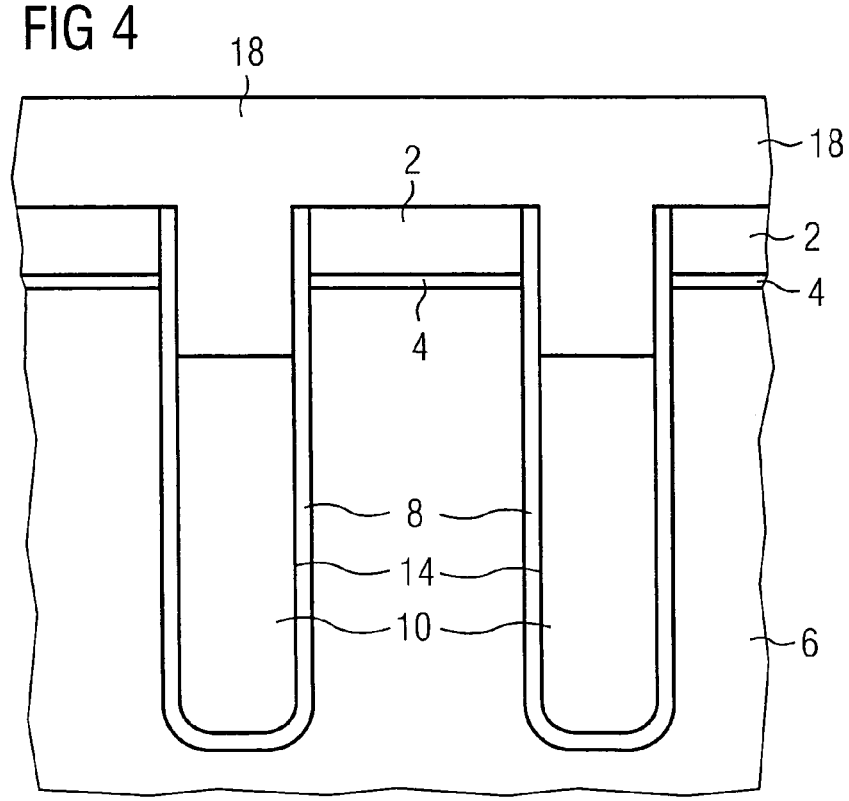
Figure 5:
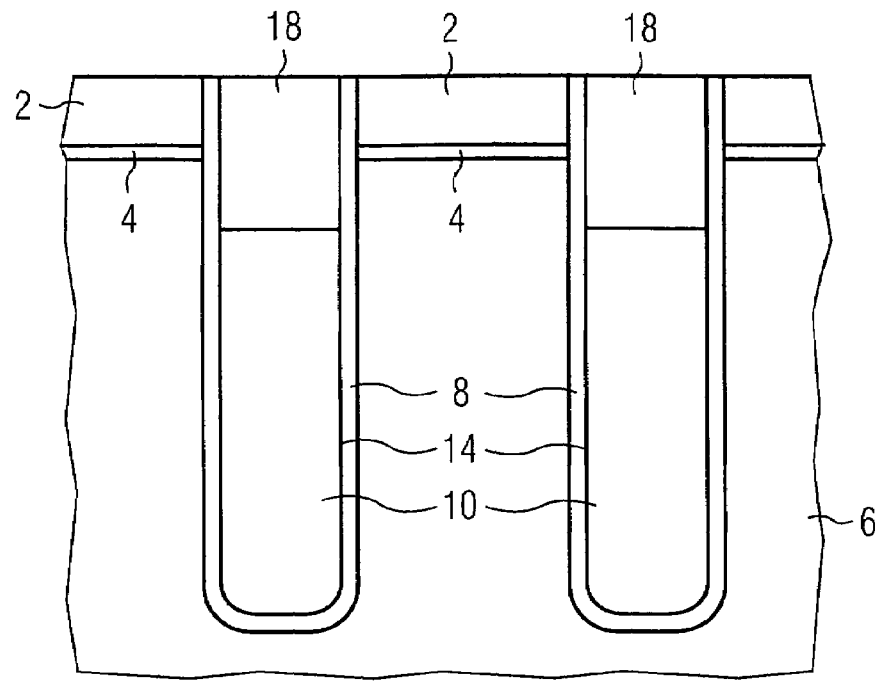

FIG. 4 shows the deposition of an oxide layer 18 (TEOS or from a high density plasma, HDP), followed by chemical mechanical polishing of the oxide layer in order to restrict the oxide layer 18 to a filling of the trench top portion (FIG. 5).

Figure 6:
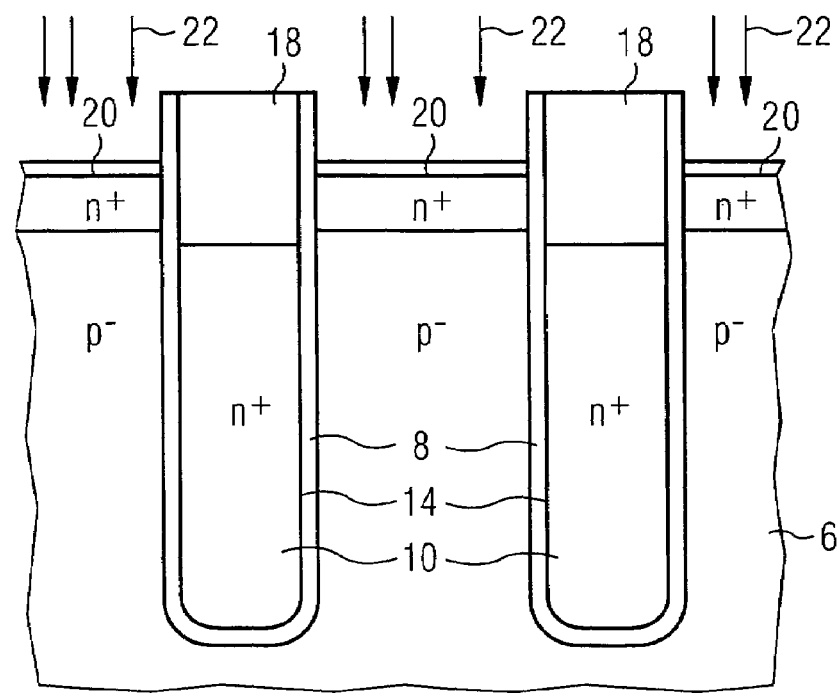

FIG. 6 depicts the removal of the nitride layer 2 due to wet etch and the n$^+$-implant 22 of underlying surface portions of the substrate 6 to yield n$^+$-junctions, or diffusion regions 20. These regions serve as source/drain regions for the memory cells. The effective depth of the implant or of the diffusion regions 20 is such as to slightly overlap the recessed surface of the conductive poly-silicon filling 10 in the trenches 14. The two overlap regions per trench are the location of the largest energy fields during programming and thus provide hot charge carrier acceleration and their storage within adjacent portions of the charge-trapping layer 84.

Figure 7:
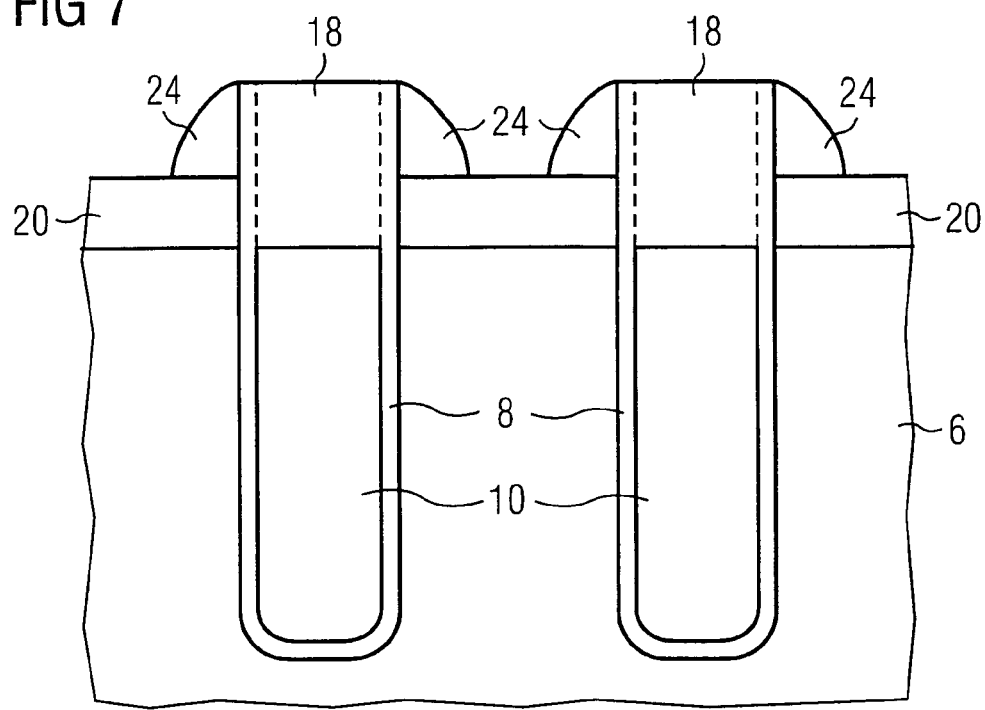

FIG. 7 illustrates the formation of spacers 24 by means of depositing, e.g., a nitride, and then back etching the nitride layer. Spacers 24 serve to provide a masking layer for etching the doped substrate main surface 12, i.e., first portions of the diffusion regions 20, while retaining second portions adjacent to the trenches 14.

Figure 8:
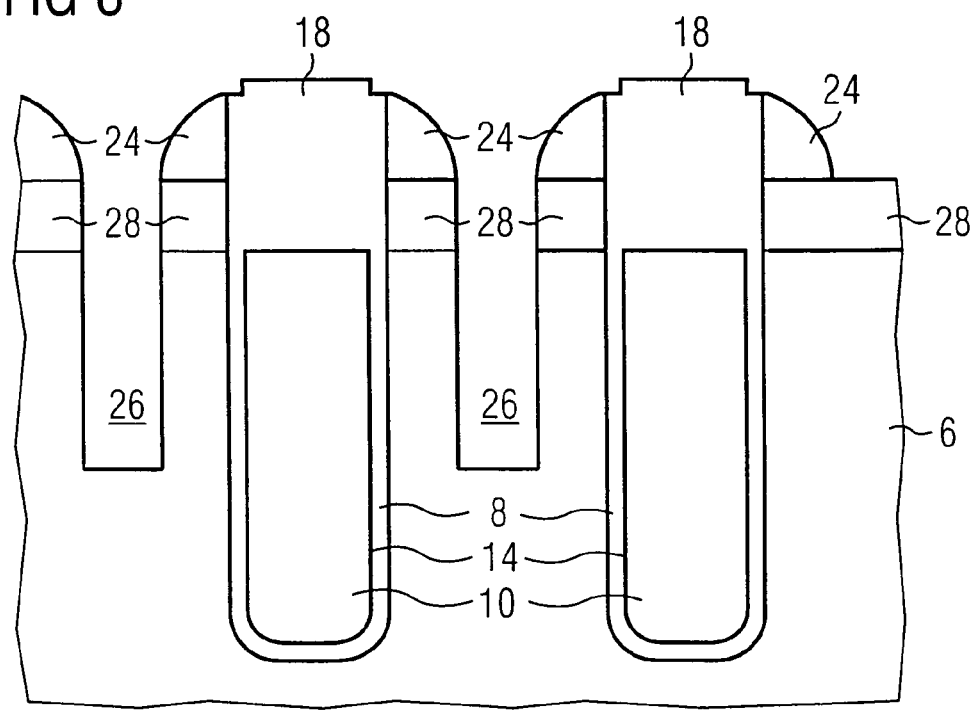

FIG. 8 shows the application of anisotropic silicon etch, followed by cleaning, in order to form further trenches 26. The etching is stopped when a depth of about 30 nm has been reached. The trenches 26 thus formed are self-aligned due to the spacers 24. As the spacers follow the parallel arrangement of word lines across the array, the self-aligned trenches 26 as well extend through the array. Diffusion regions 20 formerly shared by each two memory cells, or trenches 14, are thus divided into each two diffusion regions 28 adjacent to word line trenches 14.

The spacers 24 have a lateral width of about 20 nm each. The trench-to-trench (word lines) distance is about 55 nm. Consequently, the width of further trenches 26 amounts to about 15-20 nm.

Figure 9:
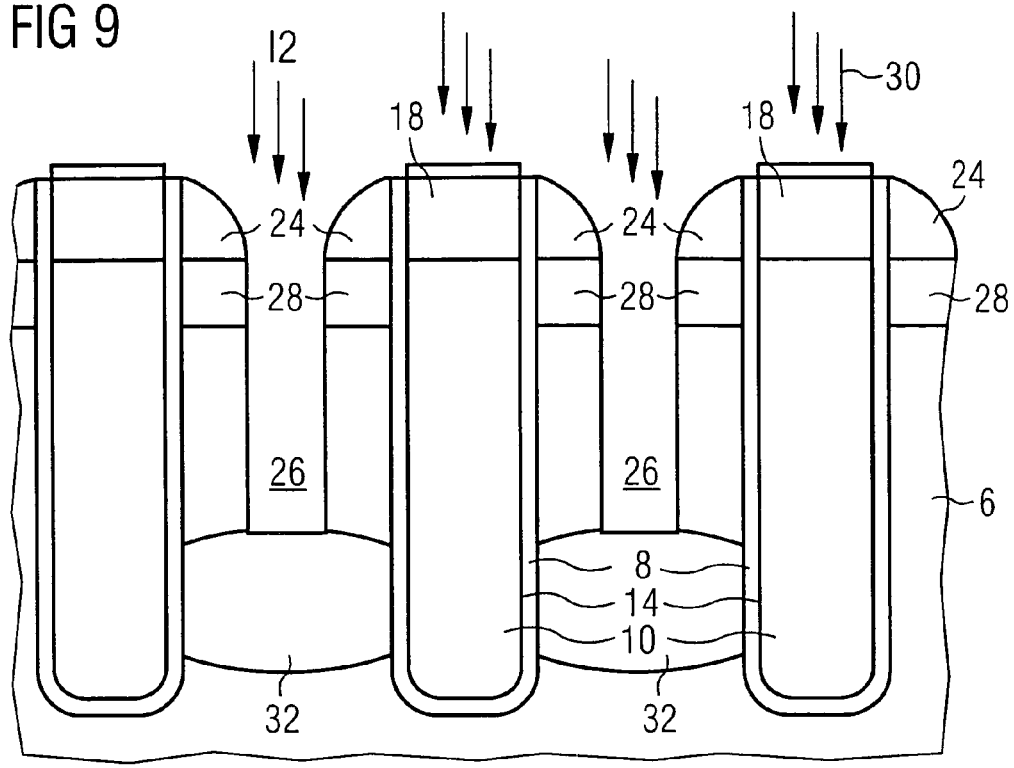

FIG. 9 shows an embodiment with an optional $I_2$-implant step 30 in order to produce a channel stop 32. This implant 30 will locally increase threshold voltage $V_{th}$, which results in a suppression of current leakage between source and drain regions of neighboring memory cells. Further processing steps lead to a spread of dopants in the substrate 6.

Figure 10:
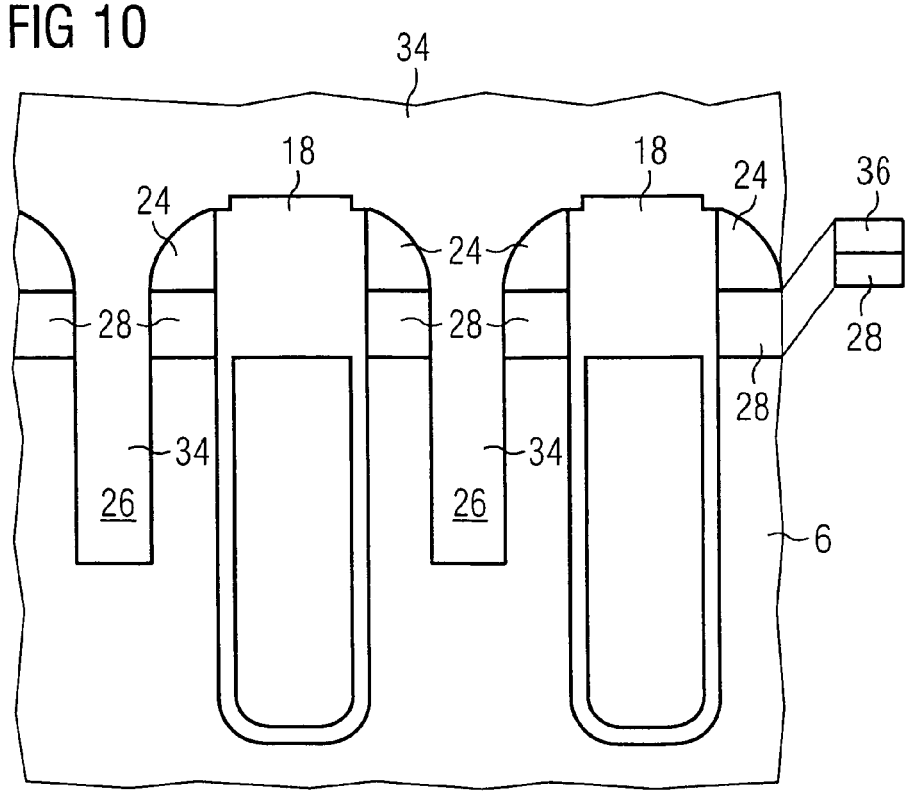

FIG. 10 illustrates the further step of depositing a CVD-oxide, wherein according to this embodiment an HDP-fill is applied. Alternatively, application of a glass, e.g., BPSG, may also advantageously be applied. The occurrence of voids may also be intended, since the absorption characteristics of air with regard to hot charge carriers are similar to dielectric materials such as oxide or nitride.

It may also be noted, with regard to FIG. 10, that the diffusion regions 28 may further be supplied with a metal layer 36 as an option in order to improve the bit line contact characteristics of the source and drain regions. The metal layer 36 in this case also applies to the other figures of the embodiment presently discussed.

Figure 11:
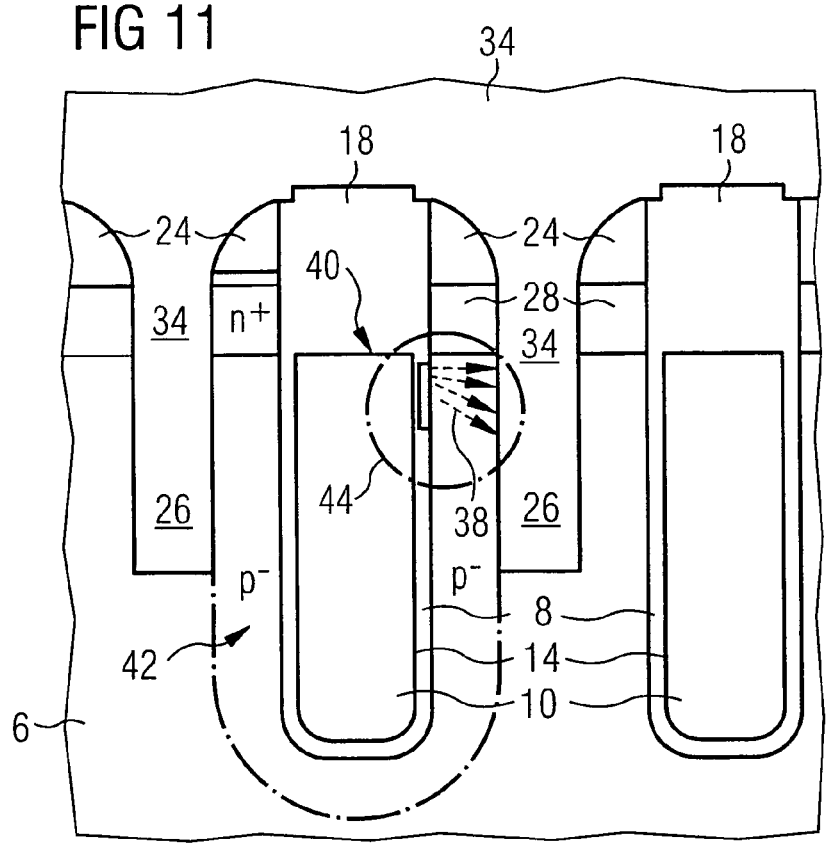

FIG. 11 illustrates the effect of the memory cell configuration reached so far. Hot charge carriers are generated priority in a zone 44 (region of injection). However, those carriers 38 having attained energies sufficient to travel through the substrate 6 towards the charge-trapping layer 8, 84 of a neighboring memory cell are blocked due the trench 26 filled with dielectric material 34 (HDP-oxide or BPSG-glass, nitride, etc.). Thus, the storage location 40 for hot charge carriers 38 being trapped by a memory layer 84 of the ONO layer sequence 8 is always confined to the present memory cell according to this embodiment.

Figure 12:
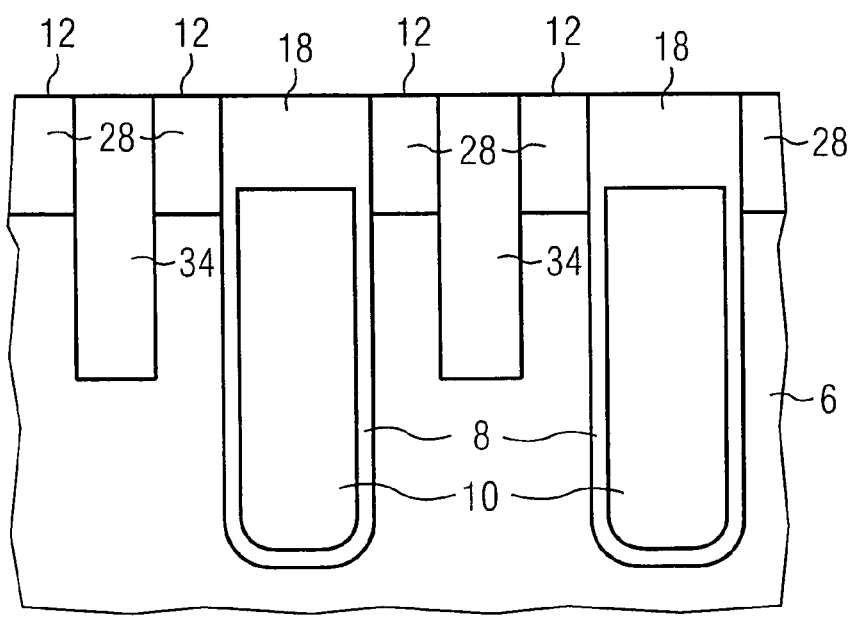

FIG. 12 reveals the situation after a CMP step has taken place. In this embodiment, the main surface 12 of the substrate 6 is exposed within diffusion regions 28, thereby. FIG. 13a shows the situation after deposition of a nitride hard mask. This hard mask 46 serves for performing an etch of trenches within the substrate 6 perpendicular to the word lines and is lithographically structured therefore. The purpose is to separate diffusion regions of memory cells arranged along the word lines, and thus to separate the storage locations 40.

FIG. 13b shows a top view of the arrangement shown in FIG. 13a at a level B-B. FIG. 13c shows a top view in a slice level A-A within the substrate, such as to clarify the location of the buried word lines WL under the trench top oxide 18.

FIG. 14a shows a cross-section in the X-direction (bit line direction), which is offset with respect to that shown in FIGS. 13a-13c.

In this case no protection due to the hard mask 46 is active and an anisotropic silicon substrate etch results in a removal of the diffusion regions 28. Preferably, 30 nm deep shallow trenches 50 are formed thereby—as measured from the depth of the p/n-junction (junction between n-diffusion zone of the source/drain region and p-well beneath the channel region). The depth is ideally, but not necessarily, similar to that of further trenches 26.

FIG. 14*b* shows a top view with respect to slice level A'-A' as indicated in FIG. 14*a*, wherein the diffusion regions 28 as well as considerable portions of the channel region 42 have disappeared along a section C-C not protected by the hard mask 46.

FIG. 15*a* shows the situation along section C-C after a thin oxide liner and a HDP oxide 34' are deposited to fill trenches 50. In this embodiment, trenches 26 and trenches 50 are filled with the same isolating material (HDP-oxide 34, 34') and have the same depth. FIG. 15*b* shows a top view including the hard mask onto level E'-E' near the surface. It becomes clear that the hard mask 46 served to remove substrate portions in order to separate diffusion regions between adjacent memory cells distributed along a buried word line.

The situation after removal of the hard mask 46 is depicted in FIGS. 16*a*-16*c*. FIG. 16*a* is equivalent to FIG. 15*a*, FIG. 16*b* is equivalent to FIG. 13*a*, and FIG. 16*c* shows the top view at the surface. The separation of diffusion regions 28 becomes clearly visible. The area of one cell is indicated as a dashed circle. Each diffusion region serves to program one bit, i.e., two bits per cell.

Further, dot-dashed lines indicate the position of local interconnects 52 to be formed subsequently, which realize a virtual ground array architecture. That is, the diffusion regions 28 are finally electrically reconnected to provide a common bit line contact to both diffusion regions, which have previously been disconnected due the etching of trenches 26.

Each local interconnect is further provided with a bit line contact 54 to connect to a bit line (not shown in FIG. 16).

Although the present invention and its advantages have been described in detail, it should be understood that various changes, substitutions and alterations can be made herein without departing from the spirit and scope of the invention as defined by the appended claims.

What is claimed is:

1. A method of forming a charge-trapping memory device having an array of memory cells, the method comprising:
providing a semiconductor substrate with a main surface;
forming first trenches within said semiconductor substrate, said first trenches having sidewalls;
doping said sidewalls to form U-shaped channel regions;
depositing a sequence of dielectric layers over the sidewalls of said first trenches, said sequence of dielectric layers comprising a bottom confinement layer, a memory layer and a top confinement layer;
filling said first trenches with a conductive material that overlies said sequence of dielectric layers to form gate electrodes and word lines;
doping said main surface adjacent to said first trenches to form diffusion regions, said diffusion regions serving as sources/drains of each of said memory cells;
forming second trenches parallel to said first trenches, said second trenches formed within said semiconductor substrate thereby subdividing each of said diffusion regions into a first diffusion region adjacent to one of said first trenches of a first charge-trapping memory cell and a second diffusion region adjacent to another one of said first trenches of a second charge-trapping memory cell;
filling said second trenches with dielectric material; and
performing an implantation after forming of said second trenches and prior to filling said second trenches in order to form a buried channel stop between said U-shaped channel regions of said charge-trapping memory cells for avoiding leakage currents from channel to channel.

2. The method according to claim 1, wherein dielectric material used for depositing said top confinement layer and said bottom confinement layer is an oxide.

3. The method according to claim 1, wherein said top confinement layer is deposited with a thickness of more than 10 nm and less than 70 nm.

4. The method according to claim 1, wherein said bottom confinement layer is deposited with a thickness of more than 5 nm and less than 20 nm.

5. The method according to claim 1, wherein dielectric material used for depositing said memory layer is a nitride.

6. The method according to claim 1, wherein said memory layer is deposited with a thickness of more than 4 nm and less than 10 nm.

7. The method according to claim 1, wherein filling said second trenches comprises filling said second trenches with an oxide.

8. The method according to claim 7, wherein filling said second trenches comprises filling said second trenches with BPSG.

9. The method according to claim 7, wherein filling said second trenches comprises filling said second trenches with EDP oxide.

10. The method according to claim 1, wherein filling said second trenches with said dielectric material includes forming air-filled voids within said dielectric material filling said second trenches.

11. The method according to claim 1, wherein forming said first trenches comprises:
providing a masking layer over said main surface of said semiconductor substrate, said masking layer provided with trench openings; and
etching said semiconductor substrate within said trench openings to form said first trenches;
wherein filling said first trenches comprises filling said first trenches with said conductive material and planarizing the surface;
and wherein forming said second trenches comprises removing said masking layer to expose said semiconductor substrate and to form trench top portions with said dieletric material protruding from said main surface of said semiconductor substrate;
forming spacers at said trench top portions with said dielectric material protruding from said main surface of said semiconductor substrate; and
using said spacers as an etch mask when performing the step of forming said second trenches.

12. The method according to claim 11, wherein said conductive material is recessed within said trench top portions, and said trench top portions are then filled with another dielectric material.

13. The method according to claim 1, wherein forming said second trenches comprises forming said second trenches having a depth of more than 20 nm.

14. The method according to claim 1, wherein forming said second trenches comprises forming said second trenches having a width of more than 10 nm.

15. The method according to claim 1, wherein forming said second trenches comprises forming said second trenches having a width of less than about 20 nm.

16. The method according to claim 1, wherein forming said second trenches comprises forming said second trenches having a depth of less than about 50 nm.

17. A method of forming a charge-trapping memory device having an array of memory cells, the method comprising:

providing a semiconductor substrate with a main surface;
forming first trenches within said semiconductor substrate, said first trenches having sidewalls;
doping said sidewalls to form channel regions;
depositing a sequence of dielectric layers on said sidewalls of said first trenches, said sequence of said dielectric layers comprising a bottom confinement layer, a memory layer and a top confinement layer;
filling said first trenches with a conductive material that overlies said sequence of said dielectric layers to form gate electrodes and word lines;
doping the main surface adjacent to said first trenches to form diffusion regions, said diffusion regions serving as sources/drains of each of said memory cells;
forming second trenches parallel to said first trenches, said second trenches formed within said semiconductor substrate by means of etching, thereby subdividing each of said diffusion regions into a first diffusion region adjacent to one of said first trenches of a first charge-trapping memory cell and a second diffusion region adjacent to another one of said first trenches of a second charge-trapping memory cell;
performing an implantation after forming said second trenches and prior to filling said second trenches in order to form a buried channel stop between said channel regions of said charge-trapping memory cells for avoiding leakage currents from channel to channel;
filling said second trenches with dielectric material in order to impede hot charge carrier exchange between adjacent charge-trapping memory cells and planarizing said dielectric material; and
forming bit line contacts, which simultaneously contact the first and second diffusion regions.

* * * * *

UNITED STATES PATENT AND TRADEMARK OFFICE
CERTIFICATE OF CORRECTION

PATENT NO. : 7,399,673 B2 Page 1 of 1
APPLICATION NO. : 11/177245
DATED : July 15, 2008
INVENTOR(S) : Tempel It is certified that error appears in the above-identified patent and that said Letters Patent is hereby corrected as shown below:

In Col. 3, line 31, delete "the" and insert --that--.
In Col. 6, lines 38-39, delete "priority" and insert --primarily--.
In Col. 6, line 42, after due insert --to--.
In Col. 6, line 42, after 26 insert --being--.
In Col. 7, line 31, after due insert --to--.

Signed and Sealed this

Twenty-first Day of October, 2008

JON W. DUDAS
*Director of the United States Patent and Trademark Office*